United States Patent Office 3,812,020

Patented May 21, 1974

3,812,020
ELECTROLYTE AND METHOD FOR ELECTROPLATING AN INDIUM-COPPER ALLOY AND PRINTED CIRCUITS SO PLATED

John E. Vander Mey, Stirling, N.J., assignor to Allied Chemical Corporation, New York, N.Y.

No Drawing. Filed Aug. 11, 1969, Ser. No. 849,193
Int. Cl. C23b *5/32, 5/34, 5/48*
U.S. Cl. 204—24 11 Claims

ABSTRACT OF THE DISCLOSURE

This invention relates to a novel electroplating bath for the electrodeposition of metal ions from an acid solution of said metal ions and indium ions. The plating baths of this invention produce a bright, ductile, more refined grained metal coating and allow a higher limiting current density. Preferably the bath is a copper plating bath comprising a mixture of a copper salt, indium salt and an acid selected from the group consisting of sulfuric, phosphoric, fluoboric and mixtures thereof, each being present in an amount which upon dissolution in an aqueous bath provides a copper concentration from 5 to 35 grams per liter, an indium concentration such that the weight ratio of indium to copper ranges from 0.002 to 4.0 and an acid concentration from 100 to 700 grams per liter. The copper plating baths have particular efficacy in the copper plating of recessed areas, such as perforated substrates, for use as printed circuit boards.

CROSS REFERENCES TO RELATED APPLICATIONS

1. Copending application of Vander Mey, entitled "Modified Copper Fluoborate Plating Baths," Ser. No. 668,551, filed Sept. 18, 1967.
2. Copending application of Vander Mey, entitled "Acid Plating Baths," Ser. No. 746,994, filed July 23, 1968.

BACKGROUND OF THE INVENTION

This invention relates to the electrodeposition of a metal from aqueous acid plating baths. Specifically, the present invention relates to an acid copper plating bath designed especially for the copper plating of printed circuit boards.

Printed circuits are now used in practically all types of electrical and electronic equipment, including for example, radio, television, electronic computers, hearing aids, timing devices, test instruments and industrial controlled circuits. These printed circuits uusally include one or more printed circuit boards. Each board usually has a plastic insulating base, having perforations or holes at predetermined spaced locations that extend from one surface of the base to the other, and a pattern of copper conductors disposed on one surface of the base. Some of the conductors in the pattern are disposed about the holes for soldered connection to circuit component loads that are inserted in the holes, and these conductors are usually referred to as "lands." Other conductors provide contact pads; and still others provide interconnecting paths or highways between lands and between lands and contact pads. Circuit components, such as capacitors, resistors and transistors, are mounted on a surface of the board opposite the surface on which the pattern of copper conductors is disposed and these circuit components have their leads or pins inserted and physically secured in the holes, and electrically connected to the lands by solder. Frequently, the contact pads are provided by solid plugs that extend from one surface of the insulated base to the other, while the lands and interconnection paths usually are formed on one surface of the insulated base by etching or dissolving the undesired part of the copper deposit that is disposed on the surface of the base. The circuit components are secured to the base by their leads which have been inserted in the holes, the leads being soldered to the lands, usually by dip soldering.

As can be appreciated, the hole surfaces and the exposed conducting portion of the printed circuit boards must be properly plated with the copper in order for the printed circuit board to be effectively used. The substrates which are usually non-conductive are first rendered conductive by coating the substrate surface either with a copper foil laminate or by plating the substrate surface with copper, such as from an electroless plating bath. The insulated base is then sufficiently conductive to be plated by the bath composition of the present invention. Generally, the plating of the insulated base is continued until the hole surfaces of the base have a copper coating on the inside of the hole of a thickness of approximately 1 mil (0.001 inch), which is generally adequate for most circuit applications. For heavier current carrying capacity, greater thicknesses are employed. In service, the copper plate in the holes of the printed circuit wiring board having external components assembled on it with component terminals inserted in the plated hole, is subject to mechanical shock and possibly rupture due to the creation of the leverage action of the component lead, which, during operation, is subject to mechanical vibration, which in turn is transmitted through the terminal inserted in the plated hole. Also, a properly plated circuit hole is required to achieve a satisfactory current carrying capacity and permit a more reliable component connection by dip soldering without unduly restrictive control conditions. Thus, it is necessary, in order to avoid defective printed circuit boards, to achieve an even, ductile, shock resistant, copper plate deposit over the entire circuit board, including the hole surfaces.

It is known to produce acceptable copper plate deposits which are adherent and smooth with the use of organic or inorganic addition agents. When exacting requirements for brightness leveling, absence of pores, and ductility of the deposit have to be met, it was necessary heretofore to employ at least two, and usually three or more different addition agents in an aqueous electrolytic copper bath consisting otherwise of an ionized copper salt and a sufficient amount of an acid or acid salt to make the solution conductive. However, electrolytic copper plating baths, including such proposed additives, do not have the required degree of throwing power which is demanded in the copper plating of printed circuit boards. By "throwing power" it is meant the ability of the copper plate to form a smooth and adherent coating of copper on a substrate having recessed areas, such as in the through hole plating of printed circuit boards. In relation to printed circuit boards, "throw power" can be defined as the ratio between the weight of deposit on a high current density area, i.e., board area, in comparison to the weight of deposit on a low current density area, i.e., hole area.

Typically, the electrodeposition of copper from an aqueous bath has been previously accomplished with either a copper pyrophosphate, copper sulfate, or copper fluoborate plating bath. While copper sulfate and copper fluoborate plating baths have been used previously in the preparation of printed circuit boards, they have been substantially replaced by the copper pyrophosphate plating baths, the main reason being due to the fact that the copper pyrophosphate baths have better throwing power, particularly in their ability to plate in the holes of the printed circuit board. The copper fluoborate baths previously proposed, i.e., 150 to 450 grams per liter copper fluoborate which will provide copper in a concentration between about 40 to 120 grams per liter, and about 0.5 to 40 grams per liter fluoboric acid, were originally developed for high speed plating, where rapid build-up of copper was required. These baths have not been found acceptable in the copper plating of printed circuit boards, particularly in their inability to satisfactorily plate the circuit boards in the holes of the boards.

The aforementioned copending, commonly assigned applications, Ser. Nos. 668,551 and 746,994, which are hereby specifically incorporated by reference, disclose that aqueous acid copper plating baths comprising a mixture of about 5 to 35, preferably 10 to 30 grams per liter copper and about 100 to 700, preferably 150 to 600, grams per liter of sulfuric, phosphoric or fluoboric acid, exhibit unexpected throw power in their ability to copper plate the holes of printed circuit boards and fill small imperfections in the board or hole surface to provide a level copper deposit. Although these baths are satisfactory, it may be desirable to have a bath with improved properties, such as a higher limiting current density, or a bath which deposits a more refined grain coating.

It is an object of this invention to formulate an acid metal plating bath which produces a superior refined grain metal coating on a substrate at an unusually high limiting current density.

It is another object of this invention to formulate an acid copper plating bath which produces a superior refined grain copper coating on a substrate.

It is a further object of this invention to formulate an acid copper plating bath which has an unusually high limiting current density.

It is a still further object to formulate a bath which has superior throwing power.

Other objects and advantages will be readily apparent from the following descriptions.

SUMMARY

It has now been unexpectedly found that the addition of an indium salt to conventional acid metal plating baths or to the above described copending copper plating baths, results in one or more of the following beneficial properties: a more refined grain metal coating, improved ductility, improved brightness, increased limiting current density of the bath, increased throwing power, and increased tolerance of impurities in the plating bath.

DETAILED DESCRIPTION

The electroplating baths of this invention comprise aqueous acid solutions containing any metal ion capable of being deposited by electrolysis to yield a normally solid electrodeposit, and indium ion. By aqueous acid solution is meant an aqueous solution having a pH less than 7.0, preferably a pH from 3.5 to 0. Preferably the metal is selected from the group consisting of copper, nickel, zinc, tin, cadmium, silver, lead and a tin-lead or tin-lead-copper mixture. Most preferably the metal is copper. The weight ratio of indium ion to said metal ion preferably ranges from about 0.002 to 4.0, most preferably from about 0.01 to 1.0.

The acid metal plating baths are prepared and operated in the conventional manner known to those skilled in the art, except that an indium salt is also dissolved in the bath. The addition of the indium salt results in one or more of the following improvements over baths not containing indium: a more refined grain metal coating, improved ductility, improved brightness, increased limiting current density of the bath, increased throwing power, and increased tolerance of impurities in the plating bath.

The invention will be more particularly described with respect to the preferred copper plating bath. One skilled in the art, however, can readily adapt these teachings to use with the other metal plating baths of the invention.

The preferred copper plating bath may be prepared by dissolving a copper salt and an indium salt in an aqueous solution, preferably in amounts such that upon dissolution the copper salt supplies copper ions to the aqueous bath in a concentration from about 5 to 35 grams per liter, most preferably 10 to 30 grams per liter, and the indium salt supplies indium ions to the aqueous bath in a concentration such that the weight ratio of indium to copper ranges from about 0.002 to 4.0, most preferably from about 0.01 to 1.0.

A suitable acid, i.e., one which will not interfere with the deposition of the copper, is added to the aqueous bath. Preferably the acid is sulfuric acid, phosphoric acid, fluoboric acid or mixtures thereof. The preferred acid concentration is from about 100 to 700 grams per liter, most preferably 150 to 600 grams per liter.

The above copper plating bath may also be readily prepared by mixing an aqueous concentrate of copper salt, an aqueous concentrate of indium salt and a suitable acid, preferably sulfuric acid, phosphoric acid, fluoboric acid or mixtures thereof. The mixture of salts and acid is then poured directly into a plating tank and diluted with water to the desired volume. The bath composition then may be adjusted to a specific concentration of copper ion, indium ion or acid by adding copper or indium to raise the copper or indium concentrations, or adding acid to raise the acid concentration. After final adjustment, the solution may be clarified by treatment with activated carbon and filtrated. The recommended practice is to have an auxiliary tank where the bath solution can be treated with carbon and then filtered back into the plating tank. If an extra tank is not available, the carbon can be built up on the filter pad and the solution recirculated through the filters, allowing sufficient time to remove the solids and other contaminants. Paper pulp or similar filter aids can be used. While mechanical agitation is not necessary, it can be advantageously employed in the form of a moving work rod or motor driven agitator. The use of agitation permits plating at higher current densities and the agitation of the bath solution facilitates the solution being passed through the holes punched in the printed circuit board which aids in the deposition of the copper in these holes. It also appears that some of the indium is co-deposited with the copper.

The copper ions and indium ions are derived from salts soluble in the aqueous acids of this invention. Preferably the copper ions are derived from copper sulfate, copper phosphate, copper fluoborate, or mixtures thereof, and the indium ions are derived from indium sulfate, indium phosphate, indium fluoborate or mixtures thereof. When the acid is sulfuric acid, the copper ions are preferably derived essentially from copper sulfate, copper fluoborate or mixtures thereof, most preferably copper sulfate; and the indium ions are preferably derived essentially from indium sulfate, indium fluoborate or mixtures thereof, most preferably indium sulfate. When the acid is fluoboric acid, the copper ions are preferably derived essentially from copper sulfate, copper fluoborate or mixtures thereof, most preferably copper fluoborate; and the indium ions are preferably derived essentially from indium sulfate, indium fluoborate or mixtures thereof, most preferably indium fluoborate.

The operating temperature of the aqueous acid metal baths of the present invention may be varied from approximately the freezing temperature of the bath solution up to the decomposition temperature of the bath. The operating temperature of the preferred acid copper bath may be varied from approximately the freezing temperature of the bath solution, i.e., about −58° F., up to as high as about 170° F. However, the recommended operating temperatures range from about 50° F. to 120° F., the upper operating temperature being dictated by the decomposition temperature of the bath, the softening point of the plastic base substrate of the printed circuit board employed, and the type of resist used.

The preferred copper plating bath of this invention permits use of current densities up to about 50% greater than the current densities permissible with similar copper baths which do not contain indium. The permissible current density will vary widely, depending on the bath temperature, the degree of agitation employed, and the amount of copper, indium and acid concentration. In general, it is possible to use current density ranging from about 5 to 500 amps per sq. ft., preferably between 10 to 200 amps per sq. ft., with current densities below about 150 amps per sq. ft. being recommended. In practice, current densities from about 10 to 150 amperes per sq. ft., unagitated, are recommended, although higher current densities up to about 500 amperes per sq. ft. can be employed with agitation. Furthermore, the shape and size of the article to be plated can have an important effect on the maximum allowable current densities.

The anodes employed in the copper plating bath of the present invention may be either rolled, annealed or electrolytic copper anodes, with the effective anode area approximately equal to the cathode area. Should the formation of a reddish brown powder on the anodes be observed during the plating operation, a condition common to acid copper baths, it may be desired to bag the anode in a material which will aid in maintaining a clear bath, e.g., Vinyon or Dynel, and thereby require less frequent filtration. This will be necessary when the bath solution is agitated, since the powder would be swept from the anode and become suspended in the plating solution, often resulting in rough nodular deposits on the cathode.

Salts of the aforementioned suitable acids may be added to the plating baths to improve the grain of the deposited metal. If desired, brightening agents may also be added without adversely affecting the metal plating baths of the present invention.

EXAMPLE 1

Copper was deposited onto a brass panel from an indium containing copper fluoborate plating bath using a Hull cell. The bath was prepared by mixing copper fluoborate and indium fluoborate with an aqueous solution of fluoboric acid to give a solution having the concentrations shown in Table I below. The brass panel was plated at 1 amp for 5 minutes. A fine grained copper deposit was obtained.

TABLE I

| | Grams/liter |
|---|---|
| Copper ion | 15 |
| Indium ion | 0.05 |
| Fluoboric acid | 340 |

EXAMPLE 2

Tensile and elongation tests were run on copper deposited on a stainless steel panel. The copper deposit had a thickness of 0.0015 inch (1.5 mils). The bath composition comprised 15 grams per liter copper, 1.0 gram per liter indium and 340 grams per liter fluoboric acid. The bath temperature was maintained at 85° F. and the current density was 30 amps per sq. ft. Mechanical agitation was employed. The elongation of the copper stripped from the stainless steel panels (over 2 inch span) measured 27%. This was over 1½ times greater than the 17% elongation measured for copper deposited under similar conditions from a bath in which no indium was present.

EXAMPLE 3

A copper plating bath was prepared which contained 15 grams per liter copper, 1.0 gram per liter indium and 340 grams per liter fluoboric acid. Copper was plated onto printed circuit boards at increasing current densities to determine limiting current density, i.e., point at which burning of panel occurred. Limiting current density was found to be 50 amps per sq. ft., as compared to the 30 amps per sq. ft. found with a similar bath not containing indium.

EXAMPLE 4

Copper was deposited onto a brass plate from an indium containing copper sulfate plating bath using a Hull cell. The bath was prepared by mixing copper sulfate and indium sulfate with an aqueous solution of fluoboric acid to give a solution having the concentrations shown in Table II below. The brass panel was plated at 1 amp for 5 minutes. A very smooth, bright deposit was obtained.

TABLE II

| | Grams/liter |
|---|---|
| Copper ion | 20 |
| Indium ion | 4 |
| Sulfuric acid | 250 |

EXAMPLE 5

The procedure of Example 4 is repeated except that the copper salt is copper phosphate, the indium salt is indium phosphate and the acid is phosphoric acid. Results substantially similar to those of Example 4 are obtained.

EXAMPLE 6

The procedure of Example 4 is repeated except that the copper salt is copper fluoborate, the indium salt is indium fluoborate and the acid is an equimolar mixture of sulfuric and fluoboric acids. Results substantially similar to those of Example 4 are obtained.

EXAMPLE 7

The procedure of Example 4 is repeated except that the copper salt is copper fluoborate, the indium salt is indium fluoborate and the acid is an equimolar mixture of phosphoric and fluoboric acids. Results substantially similar to those of Example 4 are obtained.

EXAMPLE 8

The procedure of Example 4 is repeated except that the acid is an equimolar mixture of phosphoric and sulfuric acids. Results substantially similar to those of Example 4 are obtained.

I claim:

1. A printed circuit board comprising a perforated substrate coated with copper, said coating deposited from an aqueous acidic electrolytic plating bath containing copper in a concentration from 5 to 35 grams per liter, indium in such concentration that the weight ratio of indium to copper ranges from about 0.002 to 4.0, and an acid, selected from the group consisting of sulfuric acid, phosphoric acid, fluoboric acid, and mixtures thereof in a concentration from 100 to 700 grams per liter.

2. The printed circuit board of claim 1 wherein the weight ratio of indium to copper in the plating bath ranges from about 0.01 to 1.0.

3. An electroplating bath for the electrodeposition of copper comprising an aqueous acidic solution containing (1) a copper ion in amounts ranging from about 5 to 35 grams per liter, said ion being capable of being deposited by electrolysis to yield a normally solid electrodeposit, (2) an indium ion in such concentration that the weight ratio of indium ion to copper ion ranges from about 0.002 to 4.0, and (3) fluoboric acid in an amount ranging from 100 to 700 grams per liter.

4. The electroplating bath of claim 3 wherein the acid is present in a concentration from about 150 to 600 grams per liter.

5. The electroplating bath of claim 3 wherein the copper is derived essentially from copper fluoborate, copper sulfate or mixtures thereof, and the indium is derived essentially from indium fluoborate, indium sulfate or mixtures thereof.

6. An electroplating bath for the electrodeposition of copper ions comprising essentially an aqueous solution containing fluoboric acid in an amount ranging from about 100 to 700 grams per liter, copper fluoborate in an amount such that the copper ion is present in an amount ranging from about 5 to 35 grams per liter and indium fluoborate in an amount such that the weight ratio of indium ions to copper ions ranges from about 0.002 to 4.0.

7. The electroplating bath of claim 6 wherein the fluoboric acid concentration ranges from about 150 to 600 grams per liter, the copper ion concentration ranges from about 10 to 30 grams per liter, and the indium ion concentration is such that the weight ratio of indium ions to copper ions ranges from about 0.01 to 1.0.

8. A method of producing a fine grain, ductile copper plating on a substrate comprising the step of electrodepositing copper on said substrate from an aqueous acidic copper plating bath containing (1) copper in a concentration of from 5 to 35 grams per liter, wherein the copper is derived essentially from copper sulfate or copper fluoborate (2) indium in a concentration such that the weight ratio of indium to copper ranges from 0.002 to 4.0 wherein the indium is derived essentially from indium fluoborate, indium sulfate or mixtures thereof, and (3) fluoboric acid in a concentration from 100 to 700 grams per liter.

9. The method of claim 8 wherein the copper concentration is from 10 to 30 grams per liter and the acid concentration is from 150 to 600 grams per liter.

10. The method of claim 8 wherein the copper is derived essentially from copper fluoborate and the indium is derived essentially from indium fluoborate.

11. A method of producing a fine grain, ductile copper plating on a printed circuit board containing perforations comprising the step of electrodepositing copper on said printed circuit board from an aqueous acidic copper plating bath containing (1) copper in a concentration of from 5 to 35 grams per liter, wherein the copper is derived essentially from copper sulfate or copper fluoborate (2) indium in a concentration such that the weight ratio of indium to copper ranges from 0.002 to 4.0 wherein the indium is derived essentially from indium fluoborate, indium sulfate or mixtures thereof, and (3) an acid selected from the group consisting of sulfuric acid, phosphoric acid, fluoboric acid and mixtures thereof in a concentration from 100 to 700 grams per liter.

References Cited

UNITED STATES PATENTS

| | | | |
|---|---|---|---|
| 2,458,839 | 1/1949 | Dyer et al. | 204—43 X |
| 2,897,409 | 7/1959 | Gitto | 204—24 X |
| 2,751,341 | 6/1956 | Smart | 204—43 |

FOREIGN PATENTS

| | | | |
|---|---|---|---|
| 145,102 | 4/1962 | USSR | 204—43 |
| 666,392 | 2/1952 | Great Britain | 204—44 |
| 565,427 | 10/1958 | Canada | 204—43 |

OTHER REFERENCES

Abner Brenner, "Electrodeposition of Alloys," vol. II, p. 160 (1963).

GERALD L. KAPLAN, Primary Examiner

U.S. Cl. X.R.

204—43 R, 43 Z, 43 S, 43 T, 44